United States Patent

Free

[15] 3,660,773

[45] May 2, 1972

[54] INTEGRATED CIRCUIT AMPLIFIER HAVING AN IMPROVED GAIN-VERSUS-FREQUENCY CHARACTERISTIC

[72] Inventor: Maurice G. Free, Tempe, Ariz.

[73] Assignee: Motorola, Inc., Franklin Park, Ill.

[22] Filed: Feb. 5, 1970

[21] Appl. No.: 8,835

[52] U.S. Cl. ............................330/30 D, 330/17, 330/30 R, 330/38 M, 330/69

[51] Int. Cl. .......................................................H03f

[58] Field of Search .......................330/30 R, 30 D, 38 M, 69

[56] References Cited

UNITED STATES PATENTS

| | | | |
|---|---|---|---|
| 3,309,538 | 3/1967 | Ashley et al. | 330/30 D |
| 3,416,088 | 12/1968 | Baldwin | 330/30 D |
| 3,386,041 | 5/1968 | Bell | 330/30 X |

OTHER PUBLICATIONS

" IC Audio Amplifier Puts Out 5 Watts" Electronics pp. 111, 112; November 1968

*Primary Examiner*—Roy Lake
*Assistant Examiner*—Lawrence J. Dahl
*Attorney*—Mueller & Aichele

[57] ABSTRACT

Disclosed is an operational amplifier including an input differential amplifier stage and an output driver stage, with each of the input and output stages having pole compensating capacitance means therein for improving the gain-versus-frequency characteristic of the amplifier. The output pole compensating capacitance means is a high voltage MOS capacitor which splits two of the poles of the amplifier's transfer function, broadbanding one of the poles and narrow-banding the other of the poles to improve the gain-versus-frequency characteristic of the amplifier. The input pole compensating capacitance means is a low voltage PN junction capacitor which relocates one of the poles of the amplifier's transfer function to thereby further improve the gain-versus-frequency characteristic of the amplifier while at the same time minimizing the total monolithic integrated circuit die area required for the fabrication of the input and output pole compensating capacitance means.

17 Claims, 4 Drawing Figures

INVENTOR.
Maurice G. Free
BY
Mueller, Aichele & Rauner
ATTY'S.

INVENTOR
Maurice G. Free
BY
Mueller, Aichele & Rauner
ATTY'S

INTEGRATED CIRCUIT AMPLIFIER HAVING AN IMPROVED GAIN-VERSUS-FREQUENCY CHARACTERISTIC

BACKGROUND OF THE INVENTION

This invention relates generally to operational amplifiers and more particularly to a novel monolithic integrated circuit operational amplifier having an improved gain-versus-frequency characteristic.

The technique for compensating for the affect of certain poles of an amplifier's transfer function on the gain-versus-frequency characteristic thereof is known in the art. One such novel technique is disclosed in detail and claimed in U.S. Pat. No. 3,491,307 issued to James E. Solomon et al. and assigned to the present assignee. Certain undesirable poles of an operational amplifier's transfer function are caused by circuit resistances, such as the resistances in the DC level shifting networks of the amplifier, and various circuit capacitance, such as a transistor's collector capacitance. This combination of resistance and capacitance causes one or more of the poles of the amplifier's transfer function to occur at relatively low frequencies on the amplifier's $\sigma$ plus $jw$ frequency domain plot. The existence of such pole or poles causes the gain-versus-frequency characteristic of the amplifier to "roll off" at an undesirably high rate such as, for example, 12 db per octave when one of the poles of the amplifier's transfer function is sufficiently low in frequency.

As discussed and claimed in the above-identified Solomon et al. patent, a "pole splitting" capacitor may be connected between the output and the input of a two transistor cascaded amplifier stage within the amplifier, and this capacitor will cause one of two poles of the amplifier's transfer function to narrowband and the other of the two poles to broadband and thus improve the gain-versus-gain characteristic of the amplifier. Thus, by splitting two of the poles of the amplifier's transfer function in accordance with the above-identified Solomon et al. invention, an improvement in gain-versus-frequency roll off from 12 to 6 db per octave can be achieved.

While the so-called pole splitting capacitors (sometimes referred to herein as pole compensating capacitors and identified as $C_p$) have the advantage of improving the gain-versus-frequency characteristic of the amplifier as previously described, the addition of this pole compensating capacitor $C_p$ to the amplifier circuit also causes a decrease in the slew rate of the amplifier. The slew rate of the amplifier is the rate of change of the amplifier's output voltage, $dv/dt$. The slew rate of the amplifier is inversely proportional to the size of the pole compensating capacitor $C_p$ in accordance with the relationship $dv/dt=I/C_p$ where $I$ is equal to the amplifier current available at the output of the amplifier to charge the pole compensating capacitor $C_p$. The addition of the pole compensating capacitor $C_p$ to the amplifier circuit is substantially equivalent to adding additional load capacitance to the output terminal of the amplifier, since both of these capacitances require a certain level of charging current from the amplifier. Thus, while the above-identified Solomon et al. invention provided an improvement in the gain-versus-frequency characteristic of the amplifier, it created other problems by decreasing the slew rate of the amplifier and increasing the size of the monolithic die required to accommodate $C_p$, whether $C_p$ is fabricated in the form of a monolithic integrated circuit PN junction capacitor or a MOS capacitor.

OBJECTS OF THE INVENTION

An object of this invention is to provide a new and improved monolithic integrated circuit operational amplifier having an increased slew rate.

Another object of this invention is to provide a new and improved amplifier of the type described having an improved small signal frequency response.

Another object of this invention is to provide a new and improved amplifier of the type described having a total reduced circuit capacitance and a reduced die area required in which to fabricate integrated circuit pole compensating capacitors.

Another object of this invention is to provide an operation amplifier of the type described having an improved step response setting time.

FEATURES OF THE INVENTION

A feature of this invention is the provision of a low voltage PN junction pole compensating capacitance means interconnecting two differentially connected input transistors in the input stage of the amplifier. This pole compensating capacitance means improves the gain-versus-frequency characteristic of the amplifier.

Another feature of this invention is the provision of the combination of the above-described low voltage pole compensating capacitance means and a high voltage pole compensating capacitance means in the amplifier's output stage. The inclusion of the low voltage pole compensating capacitance means minimizes the size of the high voltage pole compensating capacitance means and thereby minimizes the total integrated circuit die area required for the fabrication of the pole compensating capacitance means. At the same time, the slew rate of the amplifier is increased.

Another feature of this invention is the provision of separate pole compensating PN junction capacitors connected respectively to first and second transistors in the input stage of the amplifier. These capacitors bypass emitter degeneration resistors in the input stage of the amplifier and thereby improve the overall performance of the amplifier.

DRAWINGS

BRIEF DESCRIPTION OF THE INVENTION

Figure 1:
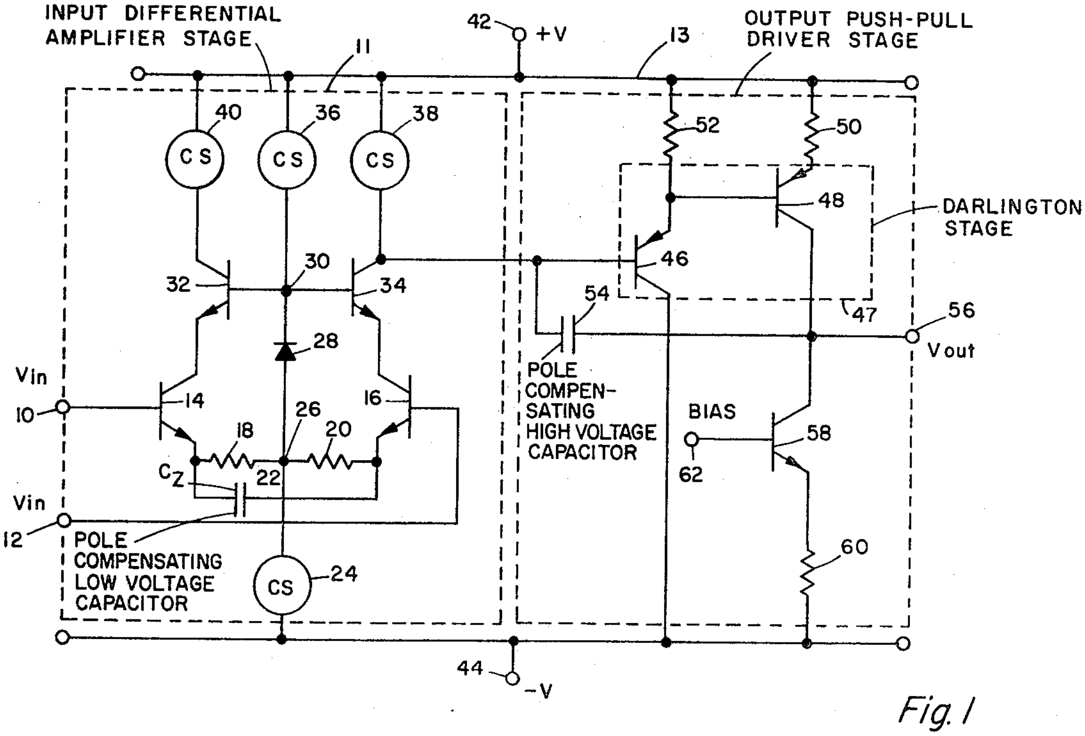
FIG. 1 is a schematic diagram of an integrated circuit embodiment of the invention.

Briefly described, the present invention includes an input transistor stage having first and second input transistors differentially coupled to receive a differential input signal and further including pole compensating capacitance means connected to the common electrodes of each of the first and second input transistors. This pole compensating capacitance means in the input stage can be in the form of a low voltage PN junction capacitance which improves the gain-versus-frequency characteristic of the amplifier. A high voltage pole compensating capacitance means is connected in the output stage of the amplifier and its size is maintained at an absolute minimum by the incorporation of the low voltage pole compensating capacitance means in the input stage of the amplifier. Thus, the pole compensating capacitance means in the input and output stages of the amplifier combine to give the amplifier a highly improved gain-versus-frequency characteristic and an increased slew rate due to the decrease in size of the high voltage pole compensating capacitance means. The inclusion of the low voltage pole compensating capacitance means in the amplifier circuit thus serves to maintain the value of the total circuit pole compensating capacitance at an absolute minimum while at the same time achieving a highly improved gain-versus-frequency characteristic, an increased amplifier slew rate, and a decreased setting time for the amplifier.

DESCRIPTION OF FIG. 1

Referring to the drawings in detail, the schematic diagrams and graphs in the FIGS. 1, 2 and 3, respectively, will be identified initially, and then the circuit operation for the amplifier circuit illustrated in FIG. 1 will be described. Thereafter, the amplifier circuit illustrated in FIG. 4 will be identified and its operation described.

The operational amplifier illustrated schematically in FIG. 1 includes a pair of differentially connected input transistors 14 and 16 having their respective input nodes 10 and 12 connected to receive an input differential signal. The collectors of transistors 14 and 16 are cascade connected, respectively, to the transistors 32 and 34, and the three current sources 36, 38 and 40 interconnect the transistors 32 and 34 as shown to the +V power supply terminal 42 as shown. A zener diode 28 established the bias potential at the common base node 30 of the transistors 32 and 34, and the current sources 36, 38 and 40 may each be one of several conventional types of current sources such as the combination of a transistor and a resistor. These current sources set the current flowing in each of the various paths in the input differential amplifier stage 11.

The emitters of the input transistor 14 and 16 are resistively interconnected via degeneration resistors 18 and 20 to a common interconnect node 26, and node 26 is connected through a current sink 24 to a negative DC voltage supply or to ground potential at terminal 44, depending upon the required current levels in the circuit. The emitter resistances $r_e$ of the NPN input transistors 14 and 16 and the swamping resistors 18 and 20 degenerate the gain of the first stage 11 of the amplifier, and swamping or degeneration resistors 18 and 20 are selected to provide an optimum trade off between the size of pole compensating capacitor $C_p$ and the required open loop DC gain of the amplifier.

A first, low voltage pole compensating capacitor $C_Z$, also identified by reference numeral 22, is connected in parallel with the two degeneration resistors 18 and 20 as shown, and during circuit operation, there is to a close approximation no voltage differential across pole compensating capacitor $C_Z$. Since this capacitor $C_Z$ is never required to withstand a high voltage, it may be fabricated as a PN junction capacitor using known diffusion processes. In addition, since there is no change in voltage across $C_Z$ during circuit operation, the capacitance of $C_Z$ will remain substantially constant.

The collector of NPN transistor 34 is connected directly into the base of transistor 46 in the two transistor cascaded stage 47 as shown, and for a single ended drive from the input amplifier stage 11, the output of only a single transistor 34 in the input amplifier stage 11 is required. Ovbiously, the collectors of both of the transistors 32 and 34 in the input amplifier stage 11 could be connected to drive a single differentially connected output stage (not shown) within the scope of this invention.

The output stage 13 further includes an NPN transistor 58 serially connected to a PNP transistor 48 across the power supply terminals 42 and 44, and the complementary transistor pair 48–58 may or may not be constructed in monolithic integrated form. It may be desired to connect these relatively high voltage transistors 48–58 external to the monolithic chip in which the operational amplifier according to the present invention is fabricated. However, it is also within the scope of this invention to fabricate the complete circuit shown in FIG. 1 in monolithic form, if desired. When output transistors 48 and 58 are connected external to a monolithic chip, they are sometimes referred to as being "out-boarded".

The amplifier's output signal V out is derived at the output terminal 56 as shown, and a predetermined bias is applied to the base node 62 of NPN transistor 58. Such biasing is required for proper operation of the circuit. This DC bias may be derived from a resistive bias string (not shown) or from other conventional bias sources.

A high voltage pole compensating capacitor $C_p$ is connected between the collector of PNP transistor 48 and the base of PNP transistor 46, and this capacitor must typically withstand operating voltages in the order of 35 volts during normal circuit operation. The pole compensating capacitor 54 may advantageously be fabricated as a metal-oxide-semiconductor (MOS) capacitor wherein one plate of the capacitor is a semiconductor region (such as a region formed by diffusion) of the semiconductor die in which an amplifier is fabricated. The other plate of the MOS capacator 54 is formed of a metal electrode overlying the semiconductor region and is separated therefrom by a layer of silicon dioxide (not shown). Such MOS capacitors are well known in the art, and the pole compensating capacitor 54 is discussed in more detail in the above-identified co-pending Solomon et al. application.

OPERATION OF FIG. 1

The differential input signal applied to input terminals 10 and 12 is amplified in a well known manner by emitter coupled input transistors 14 and 16, and the amplified signal appearing at the collector node of NPN transistor 34 is further amplified via the output PNP transistors 46 and 48. Thus, the input and output amplifier stages 11 and 13 provide the required overall amplifier gain of the circuit between the input terminals 10 and 12 and the output terminal 56.

In the absence of pole compensating capacitor $C_p$, two of the poles $p_1$ and $p_2$ of the transfer function of the operational amplifier in FIG. 1 will occur in the vicinity of approximately 4 megahertz whereas a third pole $p_3$ of the amplifier will occur in the vicinity of 50 megahertz. The occurrence of the two poles $p_1$ and $p_2$ of the amplifier's transfer function in the vicinity of 4 megahertz causes the amplifier's gain-versus-frequency characteristic to "roll off" at a rate of 12 db per octave. This high frequency roll off, which is sometimes referred to as the "skirt" of the amplifier's gain-versus-frequency characteristic, should be avoided if at all possible in the construction and operation of wide-band operational amplifiers.

The inclusion of the pole compensating or pole splitting capacitor $C_p$ connected as shown in FIG. 1 causes the two poles $p_1$ and $p_2$ of the amplifier to split, with one of the poles $p_1$ broadbanding and occurring in the vicinity of 45 megahertz and the other of the two poles $p_2$ narrowbanding in the vicinity of 35 kilohertz. The overall effect of this pole splitting compensation is that the amplifier's transfer characteristic will now roll off at approximately 6 db per octave rather than the 12 db per octave of the uncompensated amplifier. Thus, the pole compensating or pole splitting capacitor $C_p$ enhances the performance of the amplifier by providing an improved gain-versus-frequency characteristic thereof.

The pole compensating capacitor $C_p$ must normally withstand a collector voltage at the output transistors 48 and 58 which is typically in the order of 35 volts, as mentioned previously. For this reason, the capacitor $C_p$ is normally fabricated as an MOS capacitor of the type previously described. Such an MOS capacitor will typically provide approximately 0.1 picofarads per square mil of monolithic semiconductor chip area and a breakdown voltage of 100 volts. Thus, for a typical required capacitance of 30 picofarads for capacitor $C_p$, a chip area of $30/_{0.1}$ or 300 square mils of chip area is required to fabricate the capacitor $C_p$.

In accordance with the present invention, it has been discovered that the addition of another pole compensating capacitor $C_Z$ connected as shown in the input stage 11 of the amplifier circuit in FIG. 1 actually enables a reduction in total semiconductor die area required for the circuit capacitance while simultaneously enhancing the gain-versus-frequency characteristic and the slew rate of the amplifier. The addition of any circuit capacitance in the fabrication of monolithic integrated circuits normally presents the problem of an increased monolithic die or chip size, since the amount of monolithic circuit capacitance required in any given monolithic circuit is directly related to die or chip area. As is well known, capacitance is directly proportional to the semiconductor chip area in or on which the plates of the capacitor are formed, so that the addition of circuit capacitance normally means an increase in the total area required for the fabrication of an integrated circuit. However, in accordance with the present invention, it has been discovered that the combination of a low voltage pole compensating capacitor $C_Z$ and a high voltage pole compensating capacitor $C_p$ actually requires less total die area than the die area required to form the single pole compensating capacitor $C_p$ in the above-identified Solomon et al. amplifier invention. This novel feature of the present invention may be explained as follows: When a single high voltage pole compensating capacitor $C_p$ is used, approximately 30 picofarads of capacitance is required to provide the appropriate pole splitting compensation of poles $p_1$ and $p_2$ as previously described. As noted above, an MOS structure provides approximately 0.1 picofarads per square mil of die area so that a 30 picofarad capacitor requires approximately 300 square mils of chip area. It has been found, however, that the addition of the low voltage pole compensating capacitor $C_Z$ permits the circuit designer to actually reduce the picofarad value of the output pole compensating capacitor $C_p$ and still achieve the desired improvements in the gain-versus-frequency characteristic and the slew rate of the amplifier. For example, the addition of a 10 picofarad capacitor $C_Z$ allows the circuit designer to reduce the size of the output pole compensating capacitor $C_p$ from 30 picofarads to approximately 15 picofarads, so that the 10 picofarads capacitor $C_Z$ and the 15 picofarad $C_p$ provide a total circuit capacitance of 25 picofarads as compared to the 30 picofarads normally required for the output pole compensating capacitor $C_p$ of the prior art amplifier. Thus, while actually increasing the number of circuit capacitors from one to two, a design step which in itself would normally point towards increasing monolithic die area for the total circuit capacitance, the applicant herein was able to actually reduce the total capacitance required from 30 to 25 picofarads. However, more important than merely reducing the total circuit capacitance by 5 picofarads is the fact that the above described novel amplifier circuit enables the output pole compensating capacitor $C_p$ to be reduced from 30 to 15 picofarads. Thus, with a 15 picofarad $C_p$ now required, only 150 square mils of chip area is required to provide the MOS high voltage capacitor $C_p$, so that the monolithic chip area required for the MOS capacitor $C_p$ has been reduced to approximately one half of the die area required for $C_p$ alone. The low voltage diffused PN junction structure required to form the low voltage capacitor $C_Z$ provides approximately 0.5 picofarads per square mil of chip area, so that the 10 picofarad capacitor $C_Z$ requires approximately $10/_{0.5}$ or 20 square mils of chip area. Thus, the 150 square mil chip area now required for the output pole compensating capacitor $C_p$ added to the 20 square mils of chip area required for the input pole compensating capacitor $C_Z$ makes a total of 170 square mils of chip area as compared to 300 square mils of chip area required for the 30 picofarad MOS capacitor $C_p$ of the above-described prior art circuit. Thus, the total monolithic die area required for all circuit capacitance is now 170 square mils, a reduction of 130 square mils from the total monolithic die area of 300 square mils required to form the pole compensating capacitor $C_p$ of the prior art circuit. Therefore, it will be appreciated that the present invention provides an operational amplifier having an improved slew rate, an improved gain-versus-frequency characteristic, and also the requirement of a minimum of monolithic die area for the formation of the pole compensating capacitance of the circuit.

Figures 2, 3:
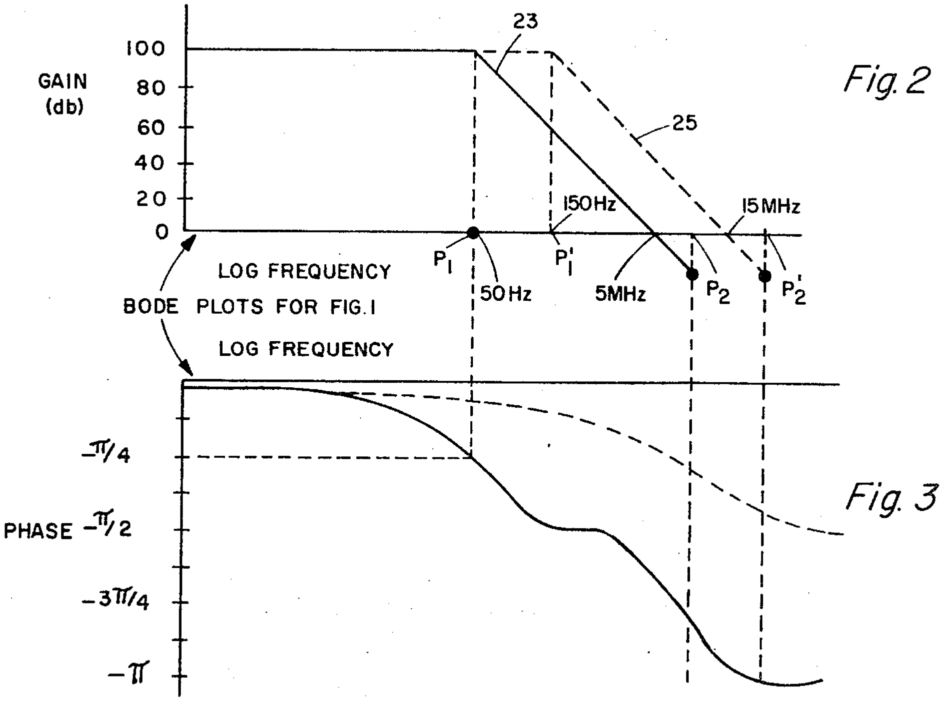
FIGS. 2 and 3 are, respectively, gain and phase Bode plots for the amplifier circuit illustrated in FIG. 1.

The present invention will be further appreciated and better understood by referring to FIG. 2 of the drawing which illustrates the improved gain-versus-frequency characteristic of the amplifier. As previously described, the output pole compensating capacitor $C_p$ splits the poles $p_1$ and $p_2$ of the first and second stages 11 and 13 of the amplifier, so that the gain-versus-frequency characteristic shown in FIG. 2 has a portion 23 thereof (representative of the prior art amplifier) which rolls off at approximately 6 db per octave beginning at a frequency corresponding to pole $p_1$. For the prior art amplifier with a single pole compensating capacitor $C_p$, the second largest pole of the system, $p_2$, is submerged below the unity gain coordinate of the gain-versus-frequency characteristic in FIG. 2. Thus, the location of poles $p_1$ and $p_2$ determine the shape of the skirt portion 23 of the amplifier's gain-versus-frequency characteristic.

The addition of pole compensating capacitor $C_Z$ to the amplifier as shown in FIG. 1 enables the frequency location of the second pole $p_2$ to be shifted to a higher frequency as denoted by $p_2'$. That is, the addition of $C_z$ to the amplifier circuit has the effect of adding a zero to the system and relocating the second pole $p_2$ of the system so that a new pole $p_2'$ is now created. $p_2'$ now replaces $p_2$ and is higher in frequency than $p_2$. In this manner, phase lead is added to the system as shown in FIG. 3 and the output pole compensating capacitor $C_p$ can be reduced in size until $p_2'$ is submerged sufficiently below the unity gain coordinate of FIG. 2 to provide a desired improved frequency response in the amplifier circuit operation. The newly created gain-versus-frequency characteristic 25 has a constant high gain for a wider frequency range than the corresponding gain-versus-frequency characteristic of the prior art amplifier. *I/C*

In addition to reducing the total monolithic die area required to form the pole compensating capacitance of the amplifier according to the present invention, the reduction in the size of $C_p$ provides an increase in the slew rate of the amplifier in accordance with the relationship $$\text{Slew rate } (dv/dt) = I/C_p$$

where *I is the current available to charge up* $C_p$, and $C_p$ is the capacitance of the output pole compensating capacitor 54. Therefore, as the size and capacitance value of $C_p$ is reduced, the slew rate of the amplifier is increased, the small signal frequency and unity gain response of the amplifier is increased and the settling time of the amplifier is reduced.

DESCRIPTION OF FIG. 4

Figure 4:
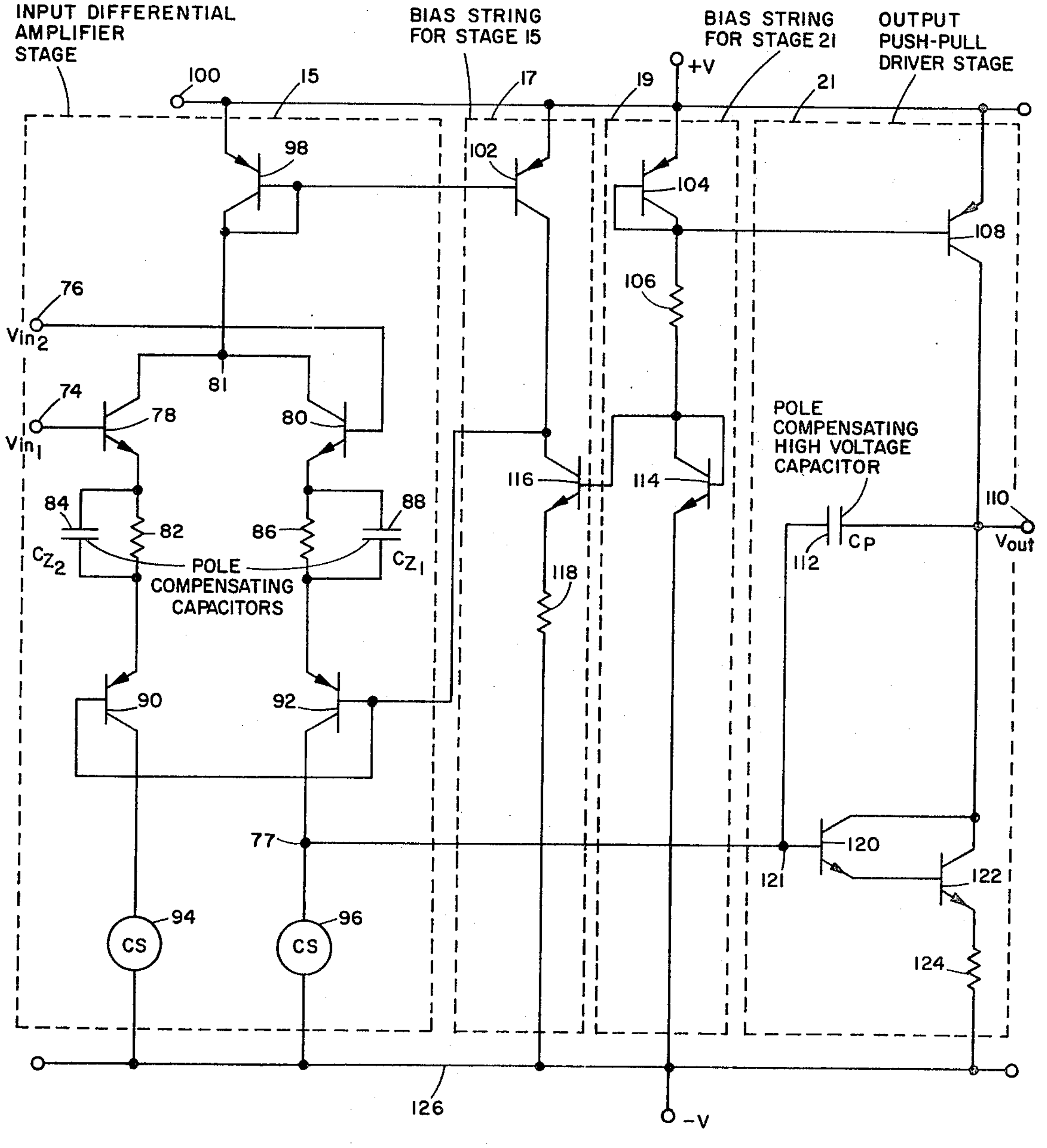
FIG. 4 is another embodiment of the invention and illustrates an alternative, amplifier circuit connection for the schematic diagram shown in FIG. 1.

FIG. 4 illustrates an alternative embodiment of the invention which includes an output pole compensating capacitor 112 and two input pole compensating capacitors 84 and 88 which will be described in more detail below. The operational amplifier circuit in FIG. 4 represents the Motorola integrated operational amplifier circuit of present commercial interest. FIG. 4 includes an input stage 15 differentially connectable at input terminal 74 and 76 to receive a differential input signal, and the output signal for stage 15 is derived at node 77 at the collector of PNP transistor 92. Node 77 is connected directly to the base node 121 of NPN transistor 120 in the push-pull output driver stage 21. The output signal for the amplifier shown in FIG. 4 is derived at the output terminal 110.

The input stage 15 of the amplifier includes differentially coupled transistors 78 and 80 connected at a common collector node 81 to a PNP transistor-shorted diode 98 which establishes the collector potential for the two transistors 78 and 80. Diode 98 interconnects the positive supply +V terminal 100 to these two input differentially coupled transistors 78 and 80, and the emitters of the two NPN transistors 78 and 80 are connected through degeneration resistors 82 and 86, respectively, to the emitters of PNP transistors 90 and 92. The latter two transistors are connected, respectively, through two current sources 94 and 96 to the other supply terminal 126, which may be at ground potential or some preselected negative voltage −V depending upon the required current levels and operating potentials for the circuit. The degeneration resistors 82 and 86 are connected in parallel with the pole compensating capacitors $C_{Z_1}$ and $C_{Z_2}$, these capacitors will be referred alternatively herein as first and second pole compensating capacitors 84 and 88.

The first bias string 17 for the input stage 15 includes a PNP transistor 102, an NPN transistor 116 and a current limiting resistor 118 which together establish the desired current level in this bias string and the DC operating potential for the input stage 15. The diode 98 in the input stage 15 is biased from the base of the PNP transistor 102, and the bases of the PNP transistors 92 and 90 are biased by the collector potential of the PNP transistor 116 in the bias string 17.

The bias string 19 for the output stage 21 includes a PNP transistor shorted diode 104, a current limiting resistor 106 and a transistor shorted diode 114 serially connected as shown between the power supply terminals 100 and 126. Diode 104 establishes the bias at the base of PNP output transistor 108, and the base of transistor 116 in the bias string 17.

OPERATION OF FIG. 4

When the signal at the collector node 77 of PNP transistor 92 swings high, NPN transistors 120 and 122 are biased from a state of low conduction to a state of high conduction, and current flows from the output terminal 110 into the collector of transistor 122 and through the current limiting resistor 124. When the signal at the collector node 77 swings in a negative direction, NPN transistors 120 and 122 become less conductive and PNP transistor 108 acts as a constant current source. The polarity of the current out of or into node 110 is dependent on the amount of conduction of NPN transistor 122. For heavy current required by certain amplifier loads, an additional current amplifier stage may be added to the output stage 21 of the amplifier and cascaded in a well known manner to the output terminal 110.

The pole compensating capacitor $C_p$, also designated by reference numeral 112, is connected as shown between the collector of the output NPN transistor 122 and the base of NPN transistor 120. Capacitor $C_p$ is an MOS capacitor and functions to split the two poles $p_1$ and $p_2$ of the amplifier's transfer function as previously described. In the input amplifier stage 15, two pole splitting capacitors $C_{Z_1}$ and $C_{Z_2}$ are connected as shown in parallel, respectively, with degeneration resistors 86 and 82, and the connection of two rather than one pole splitting capacitor in the input amplifier stage 15 is desirable for the particular input differential amplifier connection shown. The degeneration resistors 82 and 86 provide temperature stability for the input stage 15, and the emitter resistance $r_3$ of the two input transistors 78 and 80 is temperature dependent in accordance with the equation $$r_3 = KT/QI_3$$

where $K$ is the Boltzman constant, $T$ is the absolute temperature in degrees Kelvin, $Q$ is the charge on an electron in coulombs, and $I_e$ is the emitter current of each of the transistors 78 and 80.

Thus, as temperature increases, the emitter resistance $r_e$ increases and this is undesirable from the standpoint of DC stability. The percentage of emitter resistance $r_e$ variation with temperature can be quite large since $r_e$ may be typically in the order of 25 ohms, with a total of approximately 100 ohms for the four transistors 78, 80, 90 and 92. However, the addition of degeneration resistors 82 and 86, each having a resistance in the order of 7.5 kilohms, sets the current level in the input stage 15 substantially independent of the values of transistor emitter resistance $r_e$.

The two pole compensating capacitors $C_{Z_1}$ and $C_{Z_2}$ have the effect of shorting out the degeneration resistors 82 and 86 at high frequencies and thus improving the gain-versus-frequency characteristic of the amplifier. Like the pole compensating capacitors $C_Z$ in FIG. 1, these two pole compensating capacitors 84 and 88 in FIG. 4 have the effect of adding a zero to the transfer function of the amplifier and thus effectively cancelling the affects of one of the poles ($p_2$) of the amplifier's transfer function. Such pole cancellation thus extends the skirt of the gain-versus-frequency characteristic of the amplifier as previously described with reference to FIGS. 1 and 2. This extension means that the amplifier's maximum gain will remain constant over a higher frequency range than the corresponding frequency range of the amplifier which is uncompensated by input pole compensating capacitors $C_{Z_1}$ and $C_{Z_2}$. It should be noted here that the capacitors $C_{Z_1}$ and $C_{Z_2}$ are equal in value and each require one-half the semiconductor die area that is required by $C_Z$ in FIG. 1. Thus the description of FIG. 1 with reference to reducing the total die area required for pole compensating circuit capacitance applied to the circuit shown in FIG. 4. Similarly, the MOS capacitor $C_p$ in FIG. 4 is the same size in picofarads and requires the same semiconductor die area as the MOS capacitor $C_p$ in FIG. 1.

The above-described embodiments of the invention may be modified within the scope of this invention. For example, the input differential amplifier stages, the output push pull stages, and the DC bias strings described lend themselves to many obvious modifications which are within the skill of the art. Accordingly, said invention is limited only by way of the following appended claims.

I claim:

1. An amplifier having an input stage, with said input stage including, in combination:
   a. a first input semiconductor device having input, output, and common electrodes,
   b. a second input semiconductor devine having input, output and common electrodes, and
   c. pole compensating capacitance means in the order of 10 picofarads connected to the common electrodes of both said first and second input semiconductor devices for relocating a pole of the transfer function of said amplifier to thereby improve the gain-versus-frequency characteristic of said amplifier.

2. The amplifier defined in claim 1 wherein said pole compensating capacitance means includes a single capacitor directly connected between the common electrodes of said first and second input semiconductor devices for broadbanding said pole of said amplifier's transfer function.

3. The amplifier defined in claim 1 wherein said pole compensating capacitance means includes first and second capacitors connected, respectively, to the common electrodes of said first and second input semiconductor devices for bypassing common electrode resistances of said first and second semiconductor devices at high frequencies and thus improving the high frequency response of said amplifier.

4. The amplifier defined in claim 1 which further includes an output transistor stage having another pole compensating capacitance means therein so that the size of said another pole compensating capacitance means can be reduced to a value of capacitance in the order of 15 picofarads by the inclusion of said pole compensating capacitance means in said input stage of said amplifier, and the total circuit capacitance of said amplifier maintained at an absolute minimum.

5. The amplifier defined in claim 4 wherein said output stage includes:
   a. a first output transistor,
   b. a second output transistor cascaded to said first output transistor, and
   c. said another pole compensating capacitance means in said output stage connected between the output of said second output transistor and the input of said first output transistor to split two of the poles of said amplifiers's transfer function.

6. An amplifier having an input stage, with said input stage including, in combination:
   a. a first input transistor having input, output and common electrodes,
   b. a second input transistor having input, output, and common electrodes, and
   c. pole compensating capacitance means in the order of 10 picofarads connected to the common electrodes of both said first and second input transistors for relocating a pole of the transfer function of said amplifier to thereby improve the gain-versus-frequency characteristic of said amplifier.

7. The amplifier defined in claim 6 wherein said pole compensating capacitance means includes a single capacitor directly connected between the common electrodes of said first and second input transistor for broadbanding said pole of said amplifier's transfer function.

8. The amplifier defined in claim 6 wherein said pole compensating capacitance means includes first and second capacitors connected, respectively, to the common electrodes of said first and second input transistors for bypassing common electrode resistances of said first and second transistors at high frequencies and thus improving the high frequency response of said amplifier.

9. The amplifier defined in claim 6 which further includes an output transistor stage having another pole compensating capacitance means therein so that the size of said another pole compensating capacitance means can be reduced to a value of capacitance in the order of 15 picofarads by the inclusion of said pole compensating capacitance means in said input stage of said amplifier, and the total circuit capacitance of said amplifier maintained at an absolute minimum.

10. The amplifier defined in claim 9 wherein said output stage includes:

a. a first output transistor, b. a second output transistor cascaded to said first output transistor, and c. said another pole compensating capacitance means in said output stage connected between the output of said second output transistor and the input of said first output transistor to split two of the poles of said amplifier's transfer function.

11. The amplifier defined in claim 10 wherein said pole compensating capacitance means includes a single capacitor directly connected between the common electrodes of said first and second input transistors for broadbanding said pole of said amplifier's transfer function.

12. The amplifier defined in claim 11 which further includes first and second degeneration resistors serially connected between said common electrodes of said first and second input transistors and connected in parallel with said pole compensating capacitance means in said input stage for stabilizing said amplifier.

13. The amplifier defined in claim 10 wherein said pole compensating capacitance means includes first and second capacitors connected respectively to the common electrodes of said first and second input transistors for bypassing common electrode resistances of said first and second transistors at high frequencies and thus improving the high frequency response of said amplifier.

14. The amplifier defined in claim 13 which further includes first and second degeneration resistors connected in parallel with said first and second capacitors for swamping the internal transistor emitter resistances of said first and second input transistors and thereby temperature stabilizing said amplifier.

15. The amplifier defined in claim 14 which further includes third and fourth output transistors coupled to said first and second capacitors and adapted to provide an output signal for said input stage for driving said output stage of said amplifier.

16. The amplifier defined in claim 15 which further includes:

a. a first resistive-transistor bias string connected between first and second power supply terminals and connected to said input stage for DC biasing said input stage with predetermined operating potentials, and b. a second resistive-transistor bias string connected between first and second power supply terminals and further connected to said output stage for DC biasing said output stage with predetermined operating potentials.

17. An amplifier having an input stage with a high impedance output node, said input stage including, in combination:

a. a first input semiconductor device having input, output and common electrodes;

b. a second input semiconductor device having input, output and common electrodes;

c. first and second resistive elements coupled between different ones of said common electrodes and a reference potential; and d. pole compensating capacitance means connected to the common electrodes of both said first and second input semiconductor devices for cancelling the effects of the first dominant pole of said input stage existing at said high impedance output node, the value of the capacitance, $C_z$, effectively between said common electrodes being chosen such that its effect on the output of said input stage is to cause the decrease in the output at said high impedance output node due to the occurrence of said first dominant pole to be cancelled by augmenting the gain of said input stage by exactly the amount of said decrease, said first dominant pole being at the natural frequency of the RC circuit formed by the inherent parasitic capacitance and the inherent resistance between said high impedance output node and AC ground, whereby the effect of said first dominant pole in reducing the output of said input stage above said natural frequency is nullified thereby extending the frequency response of said amplifier, said capacitance value being determined by the values of said first and second resistors, said parasitic capacitance and said parasitic resistance, such that whenever the values of said first and second resistors are $R_1$ and $R_2$ respectively, whenever said parasitic capacitance has a value $C_p$ and the parasitic resistance between said high impedance node and AC ground has a value $R_p$, then said capacitance value $C_z$ is chosen to be such that $$C_z = \frac{C_p R_p}{R_1 + R^2} = \frac{1}{2f\pi(R_1 + R_2)}$$

where $f$ is said natural frequency and is determined for a given input stage by determining the frequency at which the output at said high impedance node begins said decrease, whereby determination of the actual values of $C_p$ and $R_p$ are unnecessary in the determination of the capacitance value, $C_z$, of said pole compensating capacitance means.

* * * * *